United States Patent [19]
Ohkawa

[11] Patent Number: 5,350,454
[45] Date of Patent: Sep. 27, 1994

[54] PLASMA PROCESSING APPARATUS FOR CONTROLLING PLASMA CONSTITUENTS USING NEUTRAL AND PLASMA SOUND WAVES

[75] Inventor: Tihiro Ohkawa, La Jolla, Calif.

[73] Assignee: General Atomics, San Diego, Calif.

[21] Appl. No.: 23,096

[22] Filed: Feb. 26, 1993

[51] Int. Cl.$^5$ .................. C23C 16/00; H01L 21/00
[52] U.S. Cl. ..................... 118/723 R; 118/723 E; 118/723 MP; 156/345
[58] Field of Search ............... 118/723 MP, 723 MW, 118/723 ME, 723 MR, 723 MA, 723 AN, 723 E, 723 ER, 723 I, 723 IR; 156/345, 643; 427/457, 569, 570, 571, 575, 600

[56] References Cited

U.S. PATENT DOCUMENTS 4,848,656  7/1989  Magill .................................. 239/2.1
4,948,497  8/1990  Ohkawa ................................ 209/1

FOREIGN PATENT DOCUMENTS 63-99531  4/1988  Japan .

OTHER PUBLICATIONS

Ohkawa et al., "Neutral Gas and Impurity Ion Flow Produced by a Plasma Sound Wave", Comments Plasma Phys. Controlled Fusion, vol. 15, No. 5, pp. 261–265 (1993).
Dyer et al., "Dusty Plasma Experiments", Extended Abstract for the 4th Workshop on Dusty Plasmas pp. 41–42 (Sep. 1990).
Hueter, et al., "Techniques for the Use of Sound and Ultrasonic in Engineering and Science", *Sonics*, pp. 220–225, John Wiley & Sons (New York) (1955).
Dyer, et al., "Acoustic Levitation by Oseen Drag", *J. Acout. Soc. Am*, vol. 92 (4), pp. 2207–2211 (Oct. 1992).
*Plasma Processing of Materials: Scientific Opportunities and Technological Challenges*, Chapters 2 & 3, pp. 6–36, National Academy Press, Washington D.C. (1991).
Donovan, *Particle Control for Semiconductor Manufacturing*, Chapter 2, pp. 9–24, Marcel Dekker, Inc. (New York & Basel) (1990).

*Primary Examiner*—R. Bruce Breneman
*Assistant Examiner*—Jonathan D. Baskin
*Attorney, Agent, or Firm*—Fitch, Even, Tabin & Flannery

[57] ABSTRACT

A neutral or plasma sound wave is launched into a plasma used within a plasma processing chamber in order to selectively control the location and concentration of plasma constituents, including (1) contaminants; (2) reactants, including ions or molecules; and/or (3) reaction products. The plasma sound wave comprises a periodic waveform controlled to include at least a second harmonic component. Oseen or Oseen-like forces associated with a neutral or plasma sound wave impart a drift velocity to contaminant particles, e.g., micron-sized dust particles, that moves such particles in a desired direction, e.g., away from a wafer or other work surface being processed by the plasma. An analogous Oseen or Oseen-like force associated with a plasma sound wave imparts a drift velocity to the reactants or reaction products in the plasma so as to move such atomic-sized reactants or products in a desired direction, e.g., proximate the workpiece in the case of the reactants, or removed from the workpiece in the case of the products. The drift velocity, including its direction, is controlled by controlling the harmonic content, intensity and/or phase of the neutral or plasma sound wave.

23 Claims, 6 Drawing Sheets

FIG. 6 (END VIEW)

PLASMA PROCESSING APPARATUS FOR CONTROLLING PLASMA CONSTITUENTS USING NEUTRAL AND PLASMA SOUND WAVES

BACKGROUND OF THE INVENTION

The present invention relates to plasma processing apparatus and methods, and more particularly to plasma processing apparatus and methods that use neutral or plasma sound waves to selectively control the location and concentration of plasma constituents, such as dust particles, reacting ions or molecules, and reaction products within the plasma.

In recent years, plasma processing has emerged as one of the most versatile and efficient techniques for the processing of materials in several of the largest manufacturing industries in the world. For example, in the electronics industry, plasma-based processes are indispensable for the manufacture of very large-scale integrated (VLSI) microelectronic circuits (or chips). Plasma processing is also a critical technology in the aerospace, automotive, steel, biomedical, and toxic waste management industries. For an overview of the many and varied applications that rely on plasma processing for materials processing, see, e.g., *PLASMA PROCESSING OF MATERIALS Scientic Opportunities and Technological Challenges,* National Research Council (National Academy Press, Washington, D.C. 1991).

In general, plasma processing involves the creation and maintaining of a plasma, and the application of the plasma to a particular material that is to be processed by the plasma. A plasma is a partially or fully ionized gas containing electrons, ions, and neutral atoms and/or molecules. In a typical plasma processing application, the nonlinear collective interactions of the electrically charged constituents with each other, with neutral atoms and molecules, and with electric and magnetic fields, are used to selectively process a particular material that is exposed to the plasma. For example, in a plasma etching application, the plasma is used to selectively etch a semiconductor wafer on which VLSI microelectronic circuits are being formed.

In plasma etching, and many other plasma processing applications, one of the technological challenges that must be addressed is the control of "particles" in the plasma. A "particle" is generally considered as a small piece of material that is larger than a cluster of a few molecules, but small enough to remain suspended in a fluid for a time. Most particles are not advantageous. When a particle is not advantageous to the plasma process it is referred to as a "contaminant". Dust particles are an example of contaminants that interfere with the delicate plasma etching operation used in making VLSI chips. See, e.g., Donovan, *Particle Control For Semicondcutor Manufacturing* (Marcel Dekker, Inc. New York 1990). The presence of a dust particle having a size less than about 10 $\mu m$ (where one $\mu m$ is $10^{-6}$ meters), for example, is problematical for most VLSI processing where circuit traces and other component sizes and spacings on the VLSI chip may only be on the order of 1-5 $\mu m$ or smaller. Hence, contaminants as small as 1 $\mu m$ may still play havoc with the precise etching that must be achieved in most VLSI processing applications. Thus, there is a critical need in the plasma processing art for a way to control the presence and/or location of contaminants in the plasma so that such contaminants do not interfere with the plasma processing operation that is being performed.

While filtering the gases that are used to create the plasma is effective at removing most large contaminant particles from a plasma, current filtering technology cannot remove all contaminant particles from the plasma formation gases. Thus, there will always be some medium size and smaller contaminant particles that are present in the plasma. Further, some contaminants are created as part of the plasma processing operation, i.e., they originate from the material being processed, so there is no way to effectively remove such contaminants from the plasma through filtering. Should such contaminant particles lodge on the surface of a VLSI chip, for example, they could easily short out the traces that form part of the VLSI circuit, thereby rendering such circuit inoperable. What is needed, therefore, is a way to insure that contaminant particles that are present in the plasma, from whatever source, are kept away from the surface of the material being processed, thereby preventing them from contaminating the surface of such material.

In addition to removing contaminants from the plasma processing operation, the plasma processing operation can be significantly enhanced (made more efficient) if the reactants in the plasma, e.g., ions and/or molecules, could be more heavily concentrated near the material being processed than elsewhere within the plasma. In this way the desired plasma processing reaction can occur faster. Unfortunately, such reactants are typically orders of magnitude smaller than the contaminant particles described above, and there is no known technique for controlling their concentration at a specific location in the plasma, i.e., near the material being processed, other than generally increasing their concentration throughout the entire plasma. In a typical plasma etching application, not only must the reactants be present in the plasma, but as a result of the reaction between the reactants and the material being processed, usually a chemical reaction, there are also "waste" products from the reaction that must be removed from the plasma. Usually such waste products are volatile, so they are pumped out of the plasma processing chamber. Disadvantageously, however, when the concentration of the reactants is increased, which concentration (absent the present invention) necessarily increases throughout the plasma, many of the reactants are also pumped out with the waste products, or otherwise removed from the plasma, thus limiting the efficiency of the plasma etching operation. What is needed, therefore, is a way to concentrate the reactants in the plasma near the surface or edge of the plasma where the reactants interact with the material being processed, away from the regions of the plasma where the reactants are not used and where such reactants might otherwise be removed from the plasma with the waste products.

Further, most plasma processing operations could benefit if the concentration of products resulting from the plasma processing reaction could be decreased, particularly in the region near the surface of the material being processed. That is, by decreasing the concentration of the products of reaction in the region where the plasma processing reaction is occurring, the desired plasma processing reaction can occur faster, and hence more efficiently. Thus, there is a need in the plasma processing art for a way to remove and/or decrease the concentration of the products of reaction in the region where the reaction takes place so that the desired plasma processing reaction can occur more efficiently.

SUMMARY OF THE INVENTION

The present invention addresses the above and other needs by providing a plasma processing apparatus and method that launches neutral or plasma sound waves into the plasma in order to selectively control the location of contaminants, reactants (ions and/or molecules), or the products of reaction within the plasma.

In accordance with one aspect of the invention, a neutral gas sound wave or a plasma sound wave is launched into a plasma maintained within a plasma processing chamber. The type and characteristics of the neutral or plasma sound wave are controlled to selectively control the location and concentration of: (1) contaminants, (2) reacting ions or molecules, and/or (3) products of reaction, present within the plasma, all of which items may hereafter be referred to generically as "constituents". For specificity, the contaminants, item (1), are generically referred to hereafter as "contaminant particles"; and items (2) and (3) are generally referred to as "reactants" or "products of reaction". The neutral or plasma sound wave comprises a periodic waveform shaped to include at least a second harmonic component. Oseen or Oseen-like forces associated with such waveform impart a drift velocity to contaminant particles, e.g., micron-sized dust particles, present in the plasma. Such drift velocity, including its direction, is controlled by selective adjustment of the sound wave, e.g., by changing its harmonic content and/or phase. The drift velocity is controlled to move the contaminant particles in a desired direction, e.g., away from a wafer or other work surface being processed by the plasma. An analogous Oseen or Oseen-like force associated with the plasma sound wave imparts a drift velocity to reacting ions or molecules in the plasma, thereby allowing such atomic-sized reacting agents to be selectively concentrated within the plasma at an optimum processing location, e.g., proximate the wafer or other work surface. Further, such Oseen or Oseen-like force may also impart a drift velocity to products of the plasma processing reaction so as to remove such products from the plasma, or at least to move such products or reaction within the plasma away from the site of the plasma processing reaction so that they do not interfere with the plasma reaction, thereby enabling the plasma reaction to proceed at a more rapid rate.

Note, as used herein, the term "neutral sound wave" refers to a sound wave that is carried by neutral species in a gas. The term "plasma sound wave" refers to a sound wave that is carried by ions and electrons in a plasma. Because there may be some neutral species in a plasma, it is possible for both a neutral sound wave as well as a plasma sound wave to be launched into a plasma.

One embodiment of the present invention may be broadly characterized as plasma processing apparatus. Such plasma processing apparatus includes: (a) a plasma processing chamber; (b) means for introducing a prescribed gas into such plasma processing chamber; (c) means for establishing and maintaining a plasma from the gas within the plasma processing chamber; (d) launching means for launching a periodic neutral or plasma sound wave into the plasma, where such sound wave is characterized by an intensity and fundamental frequency and harmonic content that includes at least a second harmonic, and wherein such neutral or plasma sound wave interacts with a certain type of constituent within the plasma so as to impart a drift velocity thereto; and (e) control means for controlling the characteristics of the neutral or plasma sound wave so as to cause the certain type of constituent to move within the plasma as a result of the drift velocity in a desired direction. Thus, the location of certain types of constituents within the plasma chamber may be controlled in an advantageous manner, i.e., away from the surface of the material being processed if the constituent is a contaminant particle or product or reaction, and towards or near the surface of the material being processed if the constituent is a reactant.

Another embodiment of the invention may be broadly characterized as a method of controlling the location of a certain type of particle within a plasma confined within a plasma processing reactor or chamber. Such method includes: (a) launching a periodic neutral or plasma sound wave into the plasma, where such sound wave is characterized by an intensity and fundamental frequency and harmonic content that includes at least a second harmonic, and wherein the sound wave interacts with the certain type of constituent so as to impart a drift velocity thereto; and (b) controlling the characteristics of the neutral or plasma sound wave so as to cause the certain type of constituent to move in a desired direction within the plasma as a result of the drift velocity. Thus, using such method, the location of certain types of constituents within the plasma processing reactor may be selectively controlled, e.g., away from the surface of the material being processed if the constituent is a contaminant particle or product of reaction, and towards or near the surface of the material being processed if the constituent is a reactant.

It is thus a feature of the invention to provide plasma processing apparatus, or a method of operating plasma processing apparatus, that controls the presence and/or location of constituents, such as contaminant particles and/or products of reaction, in the plasma so that such constituents do not interfere with the plasma processing operation that is being performed.

More particularly, it is a feature of the invention to provide such plasma processing apparatus or method wherein any contaminant particles present in the plasma are acted upon by a launched neutral or plasma sound wave so as to move in a desired direction in the plasma, e.g., away from the surface of the material being processed, thereby preventing such contaminant particles from contaminating the surface of such material.

It is another feature of the invention to provide a plasma processing apparatus and method that launches a plasma sound wave into a plasma for the purpose of moving the reactants in the plasma, i.e., ions and/or molecules, near the surface or edge of the plasma, thereby allowing such reactants to more efficiently interact with the material being processed, away from regions of the plasma where the reactants perform no useful function. Similarly, a related feature of the invention, applicable to certain types of configurations, is to remove products of the plasma reaction away from regions of the plasma where such products impede or otherwise interfere with the plasma processing reaction.

It is yet another feature of the invention, in one embodiment thereof, to provide a plasma processing apparatus and method that launches a neutral or plasma sound wave into a plasma for the purpose of controlling the location of both contaminant particles and reactants in the plasma so as to enhance the plasma processing operation, e.g., by keeping the contaminant particles and products of reaction away from a surface being processed, and by concentrating the reactants near the surface being processed.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

Figure 1:
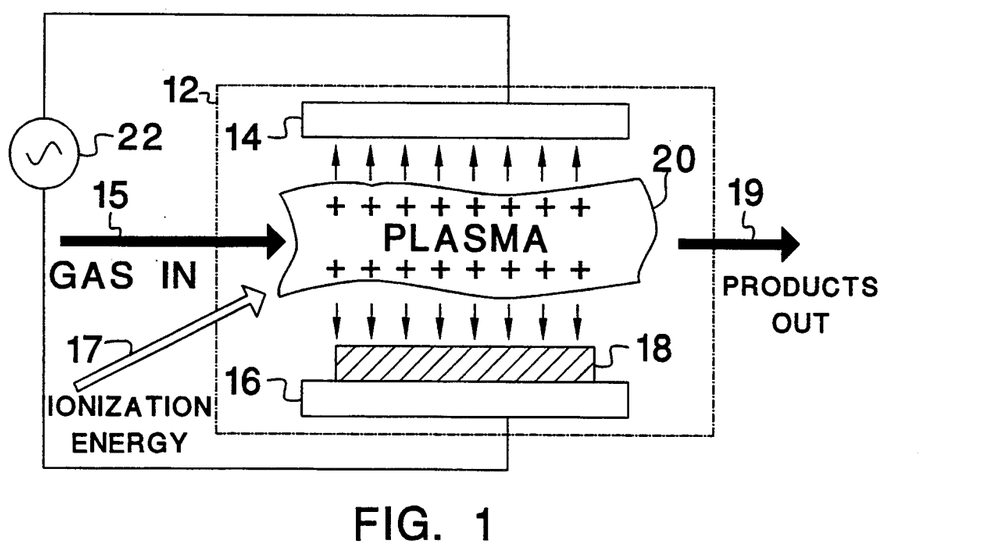
FIG. 1 is a schematic representation of a plasma processing apparatus.

Referring first to FIG. 1, there is shown a schematic representation of a typical plasma processing apparatus. Such apparatus includes a plasma chamber 12 into which a prescribed gas 15 is injected. The chamber 12 is maintained at an appropriate pressure, and conventional means 17 are used to create a plasma 20 from the gas, and maintain such plasma within the chamber. Such plasma formation means 17 may take many forms, all of which typically involve introducing sufficient energy into the gas in order to ionize it. An example of one type of plasma formation means 17 is described in applicant's commonly-owned U.S. patent application Ser. No. 07/857,981, filed Mar. 26, 1992, incorporated herein by reference.

Parallel plates or electrodes 14 and 16 are positioned on each side of the region where the plasma 20 is formed. (For some applications, such electrodes may also function as the plasma formation means.) A workpiece 18, e.g., a wafer that is to be etched by the plasma, or otherwise processed by the plasma, is placed over or near the electrode 16. A suitable bias voltage is applied between the electrodes 14 and 16 using a voltage source 22. Reactant precursor molecules, ions and electrons are created between electrodes 14 and 16. The ions are accelerated either toward or away from the workpiece 18, thereby allowing a desired plasma processing operation to take place on the workpiece, by the electric field established in the boundary region (referred to as the "sheath") that separates the plasma from the workpiece and/or electrodes. Volatile output products formed during the plasma processing operation slowly escape from the plasma chamber in a flow stream 19, which flow stream is directed to a product sink of some type, and/or is controlled with a suitable pump, or other equivalent mechanism.

It is to be emphasized that the plasma processing configuration shown in FIG. 1 is a simplified schematic representation intended to be representative of a large number of physical configurations that may be used for a plasma processing reactor or chamber. The particular plasma processing configuration that is used will depend upon the particular plasma processing application involved. Some available choices for a plasma processing configuration include distributed electron cyclotron resonance (DECR) configurations; magnetically enhanced reactive ion etcher (MERIE) configurations; planar magnetron configurations; electron cyclotron resonance (ECR) configurations; helicon configurations; helical resonator configurations; magnetically confined reactor (MCR) configurations; and triode configurations. All such configurations are described in the art See, e.g., Flamm, "Trends in Plasma Sources and Etching," *Solid Stat Technology*, p. 47 (March 1991). The present invention has applicability to all such configurations, and any other configurations used for plasma processing.

It is noted that whatever type of plasma processing configuration is used, it will typically utilize the main elements (or their equivalents) illustrated in FIG. 1, i.e., a chamber 12, means 15 for inputting a gas, means 19 for outputting products, means 17 for creating the plasma 20 from the gas; a mechanism or means whereon a workpiece 18 to be processed may be placed so it is near the plasma 20; and means 22, 14 and 16 for accelerating the reactants in the plasma towards the workpiece. Thus, FIG. 1 effectively shows a generic representation of plasma processing apparatus for purposes of the present invention.

It is further noted that for some configurations and applications, there may also be included conventional means for establishing a magnetic field (B-field) in the plasma chamber 12. However, it is to be emphasized that a magnetic field may not always be needed nor desired.

Figure 2A:
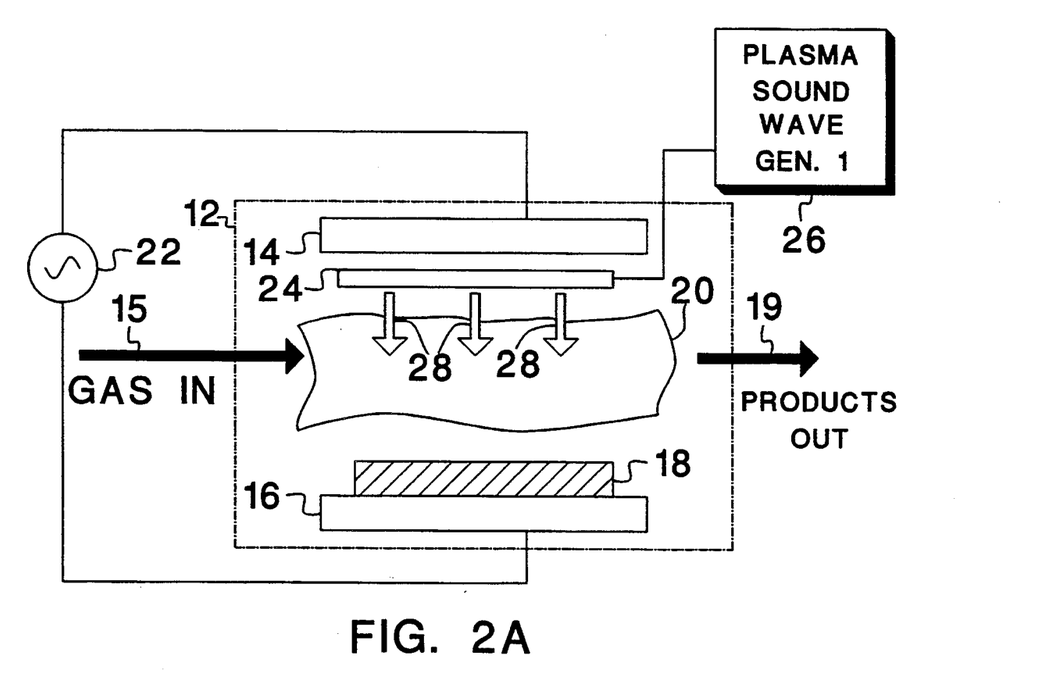
FIG. 2A is a schematic representation of a plasma processing apparatus made in accordance with the present invention wherein a plasma sound wave is launched into the plasma in order to control the location of reactants and plasma reaction products.
Figure 2B:
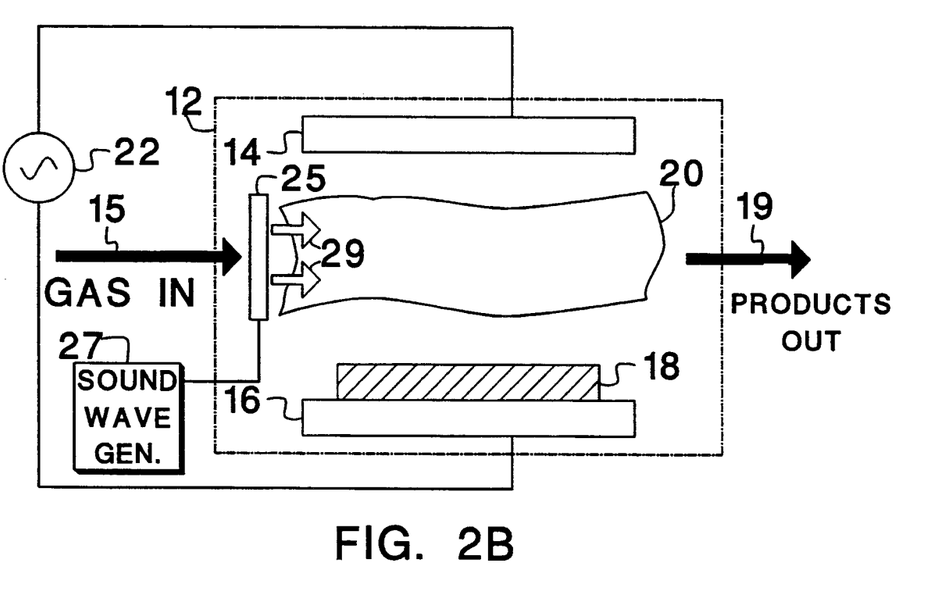
FIG. 2B is a schematic representation of a plasma processing apparatus made in accordance with the present invention wherein a neutral or plasma sound wave is launched into the plasma in order to control the location of contaminant particles.

To the basic plasma processing apparatus shown in FIG. 1, the present invention adds at least one significant element, as shown in FIGS. 2A and 2B, which figures show different embodiments of the invention. (Note, for simplicity, not all the elements shown in FIG. 1, such as the means 17 for creating the plasma, are shown in FIGS. 2A and 2B; however it is to be understood that such elements are also part of the invention).

Turning first to FIG. 2A, it is seen that means 24 for launching a particular type of plasma sound wave 28 into the plasma 20 has been added. Typically, the plasma sound wave 28 (symbolically represented by the arrows 28) is launched using a suitable launching structure 24, e.g., a suitable antenna structure or an appropriate electrode structure, driven by a first plasma sound wave generator 26. The plasma sound wave 28 is controlled in terms of its harmonic content, intensity, and phase so as to control the density and location of atomic-sized constituents, i.e., control reactants and/or reaction products, near the surface of the substrate 18.

In FIG. 2B, the element added is means 25 for launching a particular type of neutral or plasma sound wave (symbolically represented by the arrows 29) into the plasma 20. The neutral or plasma sound wave 29 is launched using a suitable launching structure 25, e.g., a particular type of antenna structure, appropriate electrode structure, loudspeaker, or the like, driven by a second neutral or plasma sound wave generator 27. The neutral or plasma sound wave 29 is controlled in terms of its harmonic content, intensity, and/or phase so as to control the density and location of macro-sized particles, e.g., particle contaminants, in the plasma. For example, the particle contaminants are controlled with the neutral or plasma sound wave by directing the flow of such particle contaminants away from the substrate 18 and into the flow stream 19 (FIG. 1).

A neutral sound wave may be used in plasma processes where the neutral collisional mean free path is smaller than the particle size. Typically, this occurs for background neutral pressures greater than about 10 Torr. A plasma sound wave may be used in either high or low neutral pressure processes.

A neutral sound wave 29 may be launched in FIG. 2B either directly through a loudspeaker or indirectly by the collisional coupling of a launched plasma sound wave with a neutral sound wave. A plasma sound wave 29 may be launched using a suitable antenna structure, e.g., a pair of spaced-apart electrodes, or a single electrode, or other appropriate structures.

Figure 3:
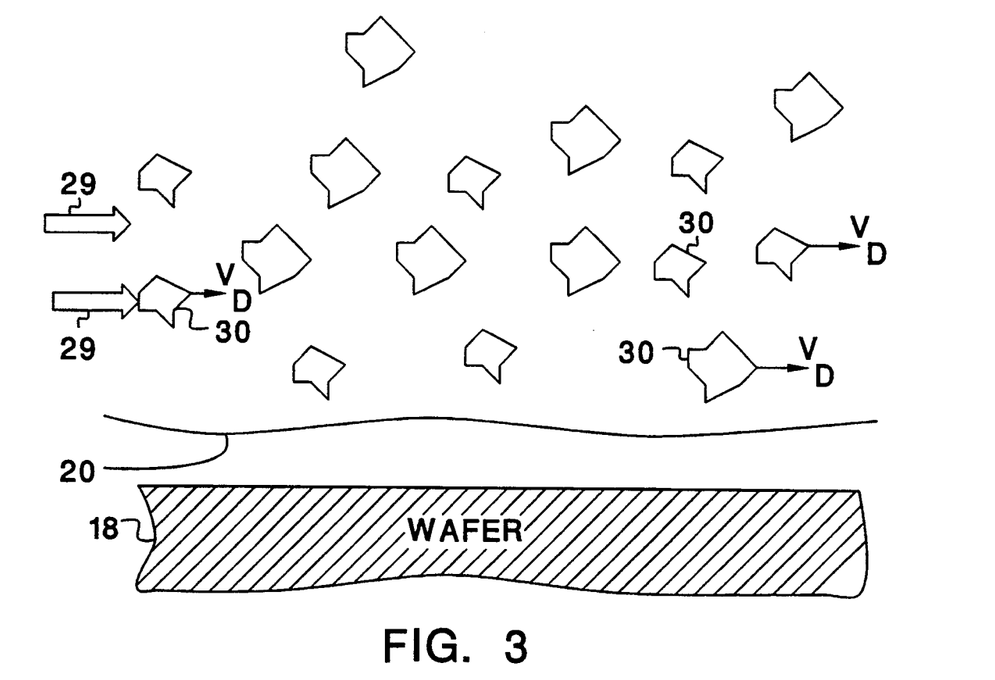
FIG. 3 schematically depicts the effect that a properly controlled neutral or plasma sound wave has on contaminant particles, e.g., dust particles, in the plasma.
Figure 4:
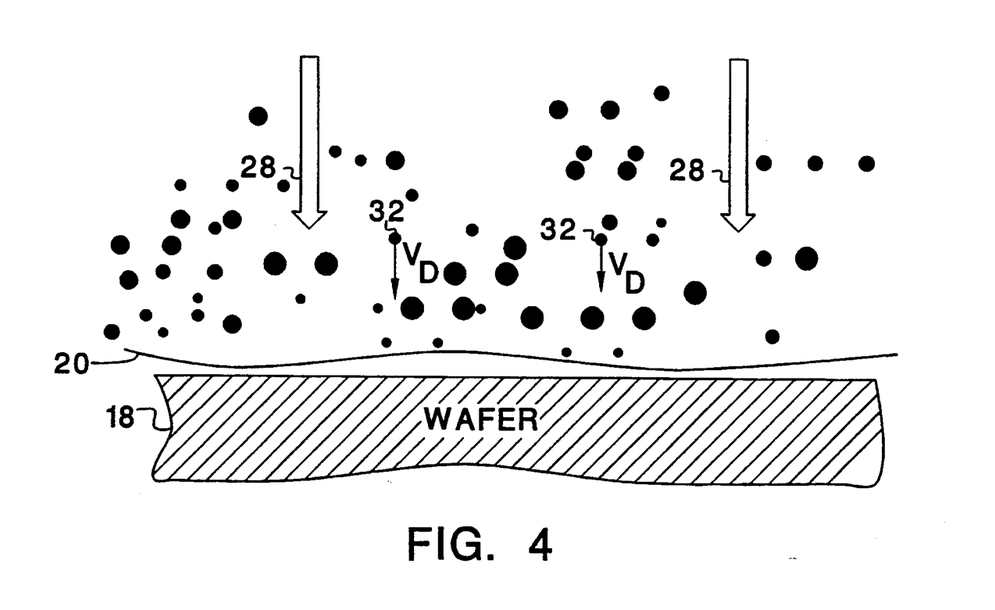
FIG. 4 schematically depicts the effect that a properly controlled plasma sound wave has on reactants (ions or molecules) in the plasma.

As explained mathematically in more detail below, the neutral or plasma sound waves 28 and/or 29 that are launched into the plasma 20 include a fundamental frequency and at least a second harmonic. Such plasma sound wave(s) interacts with the constituents in the plasma 20 so as to impart a drift velocity, $V_D$, to such constituents. When properly controlled, e.g., in terms of intensity, phase and/or harmonic content, the drift velocity $V_D$ moves such constituents in a desired direction within the plasma 20, e.g., away from the workpiece 18 and into the flow stream 19 of a pump, when such constituents are relatively large particle contaminants 30, as schematically depicted in FIG. 3. Alternatively, the constituents may be moved by the drift velocity $V_D$ towards the workpiece 18 when such constituents are atomic-sized reactants (ions and molecules) 32, as schematically depicted in FIG. 4. The effect of such drift velocity $V_D$ is thus to decrease the concentration of the contaminants 30 in the plasma in the regions near the workpiece 18 (FIG. 3), thereby minimizing the likelihood that such contaminants will find their way onto the surface of the workpiece 18; and/or to increase the concentration of the reactants 32 in the plasma in the regions near the workpiece 18 (FIG. 4), thereby improving the efficiency with which such reactants can interact with the workpiece 18 as the plasma processing operation is carried out. (Note, in the mathematical description presented below, the drift velocity with respect to the background flow velocity of the plasma is referred to as $w_0$).

Figure 8:
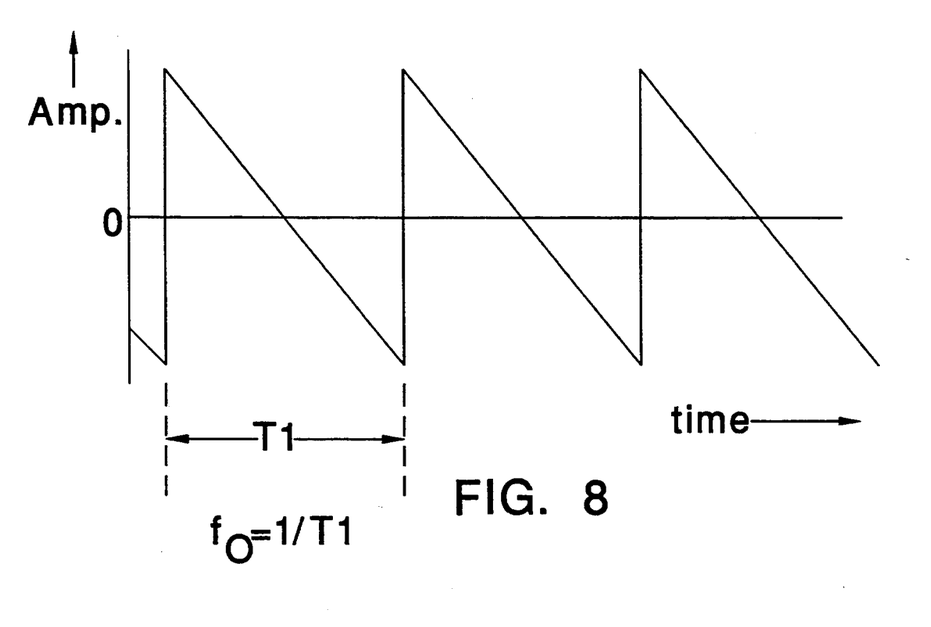
FIG. 8 shows the waveform of a typical driving signal that may be used to generate and launch a neutral or plasma sound wave having a fundamental and phased second harmonic (as well as other harmonics) in accordance with the invention.

A typical waveform generated by the plasma sound wave generator 26 (FIG. 2A) or the plasma or neutral sound wave generator 27 (FIG. 2B) is shown in FIG. 8. Such waveform must include a fundamental frequency, $f_0$, and at least a second harmonic, $2f_0$. (As seen in FIG. 8, the waveform may actually include more than the second harmonic, but it is noted that the inclusion of such additional harmonics is not necessarily detrimental to the desired operation of the invention.) As is apparent from the mathematical description presented below, the important criteria is that the waveform be a non-linear waveform that includes at least the second harmonic.

Thus, as schematically depicted in FIG. 3, it is the neutral sound wave or the plasma sound wave 29, launched from the electrode(s) 25 as controlled by the plasma sound wave generator 27 (FIG. 2), that interacts with and imparts a drift velocity to the larger contaminant particles 30. In contrast, as schematically depicted in FIG. 4, it is the plasma sound wave 28, launched from the electrode(s) 24 as controlled by the plasma sound wave generator 26 (FIG. 2) that interacts with and imparts a drift velocity to the smaller atomic-sized reactants 32.

Figure 5A:
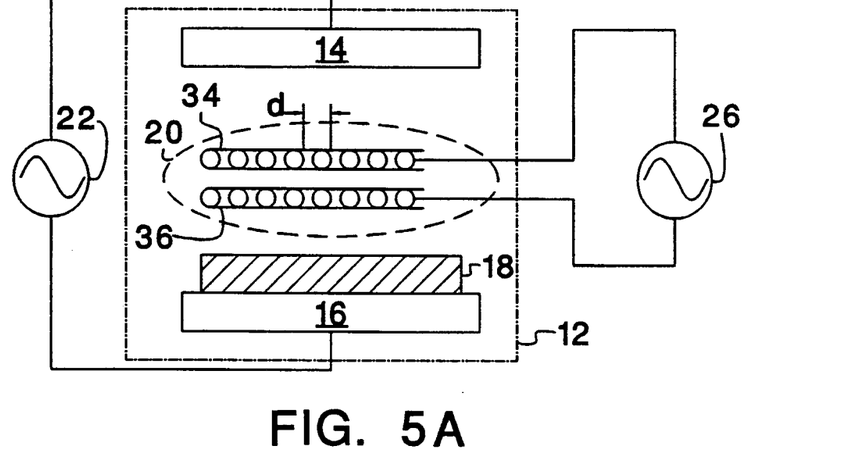
FIGS. 5A, 5B and 5C schematically show different types of neutral gas sound wave and/or plasma sound wave launching configurations, comprising spaced-apart arrays, grids of conductive wires, or a loudspeaker, respectively, that may be used within the plasma processing apparatus of FIG. 2.

Referring next to FIG. 5A, a schematic representation of one type of plasma sound wave launching configuration used to impart a drift velocity to atomic-sized particles is shown. Such configuration includes spaced-apart arrays or grids 34 and 36 of conductive wires placed near the center of the plasma chamber 12. Such grids 34 and 36 function as the electrode(s) 24 that are used to launch the plasma sound wave 28 (FIG. 2A). Alternatively, the spaced-apart grids 34 and 36 may be placed near the electrode 14 (the electrode farthest away from the workpiece 18) or near the electrode 16 (the electrode closest to the workpiece 18). The spacing d between the wires of such grids or arrays 34 and 36 is defined below in the mathematical description. The plasma sound wave 28 is launched by applying an appropriate electrical signal, such as is shown in FIG. 8, generated by the generator 26, between the launching grids 34 and 36.

Figure 5B:
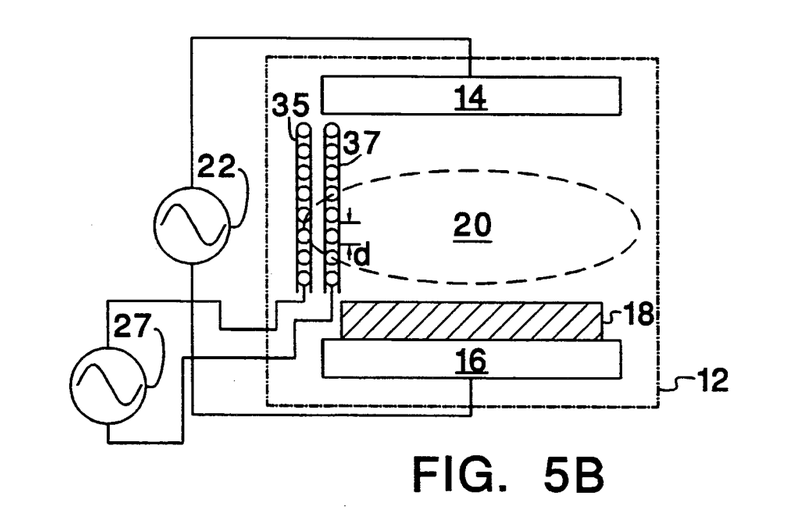

FIG. 5B shows a schematic representation of the plasma sound wave launching means 25 (FIG. 2B) used to launch the plasma sound wave 29 into the plasma 20 in order to impart a drift velocity to contaminant particles within the plasma. If the ion-neutral collision rate is sufficiently high, the plasma sound wave will couple to a neutral sound wave. At high neutral pressures, where the mean free path for neutral collisions is smaller than the particle size, the neutral sound wave, in turn, acts to impact a drift velocity to the contaminant particles. At either high or low neutral pressure, the plasma sound wave will impart a drift velocity to the contaminant particles. As seen in FIG. 5B, the launching means 25 includes spaced-apart arrays or grids 35 and 37 of conductive wires placed at the edge of the plasma 20 perpendicular to the electrodes 14 and 16. Alternatively, the spaced-apart grids 35 and 37 may be placed in or near the center of the plasma chamber 20. The spacing d between the wires of such grids or arrays 35 and 37 is defined below in the mathematical description. The plasma sound wave 28 is launched by applying an appropriate electrical signal, such as is shown in FIG. 8, generated by the generator 27, between the launching grids 35 and 37.

Figure 5C:
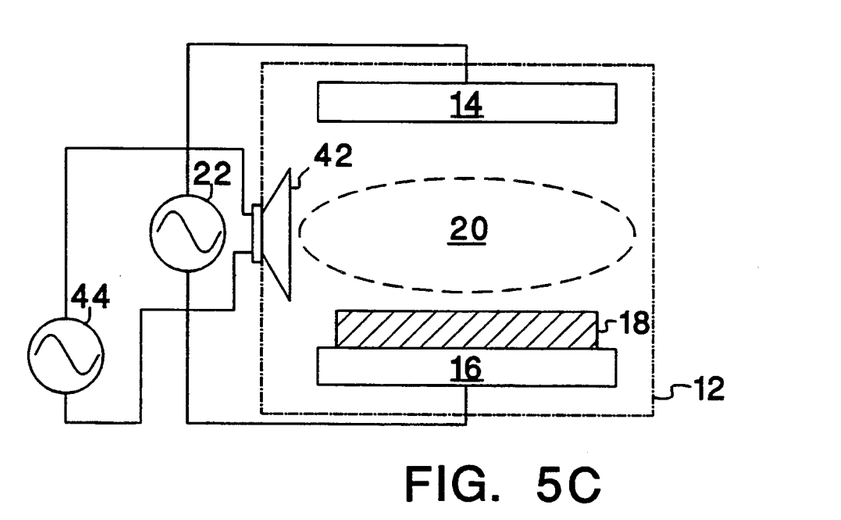

FIG. 5C shows a schematic representation of a neutral sound wave launching means used to directly launch a neutral sound wave into the plasma 20 in order to impact a drift velocity to contaminant particles within the plasma. As mentioned above, the neutral sound wave is most effective when the background neutral pressure is sufficiently high that the collisional mean free path is smaller than the particle size. As seen in FIG. 5C, such launching means includes a loudspeaker 42 placed at the edge of the plasma 20. The neutral sound wave 29 is launched by generating an appropriate electrical signal, such as is shown in FIG. 8, by signal generator 44, and applying such signal to the loudspeaker 42.

Figure 6:
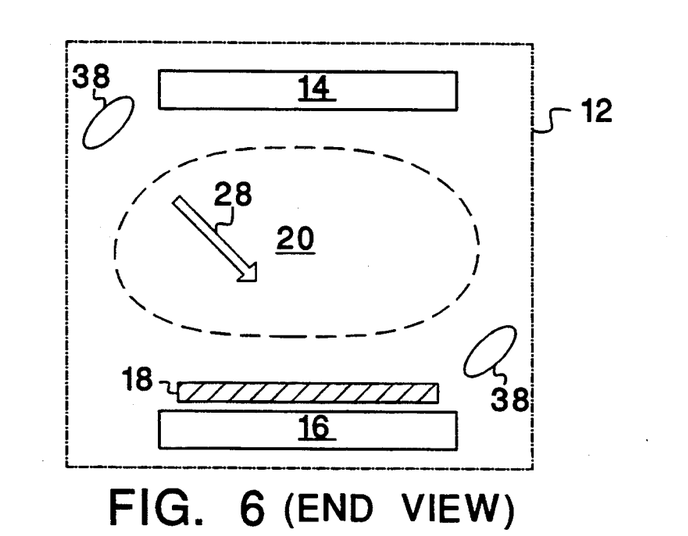
FIG. 6 is an end schematic view that shows another type of neutral or plasma sound wave launching configuration that may be used within the plasma processing apparatus of FIG. 2.

Turning next to FIG. 6, an end schematic view shows another type of plasma sound wave launching configuration that may be used by the present invention. As seen in FIG. 6, opposing electrodes, arrays, or other launching structure 38 and 40 are positioned so that a launched plasma or neutral sound wave 39, propagates diagonally through the plasma 20.

It is contemplated that the present invention will be used to impart a drift velocity to the constituents in the plasma that: (1) moves contaminant particles away from the surface of the workpiece, (2) moves reactants towards the surface of the workpiece, or (3) removes products from near the surface of the workpiece. That is, normally the invention will be used to remove contaminants from the workpiece, without any concern for moving reactants towards the surface of the workpiece. Alternatively, the invention may be used to move reactants or radicals towards the surface of the workpiece, or reaction products away from the surface of the workpiece, without any concern for moving contaminants away from the surface of the workpiece. The function performed by the invention depends on the orientation and placement of the launching structure, e.g., grid electrodes. The orientation and placement of the launching structure, in turn, depends on the specific geometry of the plasma processing apparatus that is employed. Moreover, whether reactants or products are controlled depends on the type of reactant or product being moved. That is, as shown in the mathematical description below, neutral atoms drift in an opposite direction from ions. (See FIG. 7; e.g., neutral atoms corresponding to $q=0.3$, neutral molecules, corresponding to $q=1.7$, and ions corresponding to $q=4$). Further, to improve the reaction rate, it may be sufficient to either increase the local reactant density or decrease the local product density. Doing both may not be necessary. Thus, whichever control (movement of the reactant or removal of the product) proves to be most effective for the particular plasma processing operation being carried out may be employed.

It is noted that the reason a drift velocity is imparted to the relatively large contaminant particles by the neutral or plasma sound wave as described above is due to Oseen or Oseen-like drag forces developed on the contaminant particles by the second harmonic component of the neutral or plasma sound wave 29. Similarly, Oseen or Oseen-like-like drag forces are developed on the much smaller reactant particles or reaction products by the launched plasma sound wave 28. Such drag forces only occur when the characteristics of the neutral or plasma sound wave, principally its intensity, phase and/or harmonic content, are properly controlled.

A mathematical description of the invention will next be presented, both relative to low-level and high-level plasma sound waves. Such description is not intended to be limiting, but is presented to illustrate the operability of the invention.

OSEEN FORCE IMPARTED BY A LOW-LEVEL NEUTRAL OR PLASMA SOUND WAVE

The possibility of using Oseen or Oseen-like drag forces to control dust particles in a fluid medium was described in Dyer and Ohkawa, "Acoustic Levitation by Oseen or Oseen-like drag" *J. Accoust. Soc. Am.*, 92(4), Pt 1, pp. 2207–11 (October 1992), which article is incorporated herein by reference. That which is described in the cited article relates to the use of an acoustic wave in a fluid (gaseous) medium. The acoustic wave is generated using a compression driver loudspeaker. By relying on the nonlinear dependance of the fluid drag caused by the resulting acoustic wave, levitation (i.e., an upward lifting force that overcomes the force of gravity) of small spherical particles (5 $\mu$m to 8 mm) in the medium is achieved. The present invention makes use of and extends the concept of the cited article to launching neutral sound waves or plasma sound waves in a plasma medium so as to impart a desired force, or drift velocity, on constituents in the plasma, thereby moving such constituents to a desired location in the plasma.

Before describing how the plasma sound wave interacts with the plasma constituents, it will first be helpful to review the nature of an Oseen drag force. If a particle is placed in flowing gas, it receives a drag force F. At a very small flow velocity u (or a small Reynold's number), the drag force is proportional to the velocity. Oseen made a higher order correction in terms of Reynold's number and obtained:

$$F = \alpha u(1 + \beta |u|) \tag{1}$$

where $\alpha$ and $\beta$ are constants. The Oseen force arises when the oscillating flow velocity contains the second harmonics. That is, assume the flow velocity u takes the form:

$$u = A_1 \sin(kx - \omega t + \psi_1) + A_2 \sin(2kx - 2\omega t + \psi_2) \tag{2}$$

where $A_1$ and $A_2$ are the amplitudes, $\phi_1$ and $\phi_2$ are the phases of the fundamental and the second harmonics, k is the wave number, x is distance, and $\omega$ is the frequency. The absolute value of the velocity at the fundamental frequency contains the second harmonic component. That is:

$$|A_1 \sin(kx - \omega t + \phi)| = \tag{3}$$

$$\frac{2}{\pi} A_1 - \frac{4}{3\pi} A_1 \cos[2(kx - \omega t + \phi_1)] + \cdots$$

Similarly, the square of the velocity contains the second harmonics, $$(A_1 \sin(kx - \omega t + \phi_1))^2 = \frac{A_1^2}{2}(1 - \cos(2kx - 2\omega t + 2\phi_1)) \tag{4}$$

The time averages of the drag force is given by:

$$<F> = \alpha\beta \frac{2A_1^2 A_2}{3\pi} \sin(2\phi_1 - \phi_2) \tag{5}$$

where $<>$ signifies the time average.

As seen from Eq. (5), the Oseen force depends on the difference between twice the phase of the fundamental and the phase of the second harmonics, and is independent of x.

A plasma sound wave having a short wave length is preferred to exert Oseen or Oseen-like forces on very small particles. The velocity in the above equations is the relative velocity between the particles and the gas. For small particles, the inertial effect is small and the particles tend to move with gas flow. The condition that the relative velocity is not small compared to the gas velocity may be expressed as:

$$\omega \geq \alpha/M \tag{6}$$

where M is the mass of the particle. In terms of the wave number, the condition expressed by Eq. (6) becomes $$k \geq \alpha/(Mv_s) \tag{7}$$

where $v_s$ is the velocity of the sound wave.

In a gas environment, the sound wave suffers severe damping whenever the wave length becomes comparable with the collision mean free path of gas molecules. This is not true in a plasma. That is, a plasma sound wave is not damped in this fashion. Hence, a plasma sound wave becomes an ideal candidate for pushing very small particles in the plasma.

The sound wave in a partially ionified gas is described by the equations $$m_i n_i \frac{du_i}{dt} = -en_i \nabla \phi - v_{i0} m_i (u_i - u_0) n_i - \nabla P_i \tag{8a}$$

$$m_0 n_0 \frac{du_0}{dt} = v_{i0} m_i (u_i - u_0) n_i - \nabla P_0 \tag{8b}$$

$$\tilde{n}_i = \tilde{n}_e = n_i (e\Phi/\kappa T_e) \tag{8c}$$

where the subscripts i, 0, and e denote ions, neutrals and electrons, respectively; m is the mass; n is the density; u is the velocity; $\rho$ is the pressure; $\Phi$ is the electrostatic potential; $v_{i0}$ is the ion-neutral collision frequency; $n_i$ is the perturbed ion density; and $T_e$ is the electron temperature. The dispersion relation is then given by:

$$(\omega - k^2 v_s^2/\omega + iv_{i0})(\omega - k^2 \omega_s^2/\omega + iv_{i0} n_i m_i/(n_0 m_0)) = -v_{i0}^2 n_i m_i/(n_0 m_0) \tag{9}$$

where $$v_s^2 = \kappa(T_e + \gamma T_i)/m_i \tag{10a}$$

and $$\omega_s{}^2 = \gamma \kappa T_0/m_0 \quad (10b)$$

The above equations demonstrate that the plasma sound wave and the neutral gas sound wave are coupled through collisions. Advantageously, such coupling may be exploited to launch a neutral gas sound wave by using a plasma sound wave launching structure. At a low collision frequency, it is seen that $$\omega^2 + i\omega\nu_{i0} - k^2 v_s{}^2 \simeq 0 \quad (11)$$

With $k v_s \gg i \nu_{i0}$, it is further seen that $$\omega \simeq k v_s = i\nu_{i0}/2 \quad (12)$$

The collision frequency of a noble gas ion in the same noble gas may be determined from the mobility of ions. See, e.g., Massey et al, *Electrons and Ionic Impact Phenomena*, p. 409, Oxford University Press (Amen House, London 1956). At a pressure of 1 atm, the collision frequency is approximately $10^{10}$ sec$^{-1}$. This corresponds to a collision cross-section of $4 \times 10^{-19}$ m$^2$. Since the electron temperature of the plasma of interest is much higher than the ion temperature, the plasma sound wave velocity is much larger than the ion thermal velocity. Therefore, Landau damping of the plasma sound wave is negligible.

The motion of a particle is next considered. The equation of motion is given by:

$$M \frac{dv}{dt} = qE - \alpha_i \left[ (v - u_i) + \frac{1}{3} \frac{(v - u_i)^3}{v_{thi}^2} \right] - \alpha_0 (v - u_0) \quad (13)$$

where M is the mass; v is the velocity of the particle; q is the electric charge on the particle;

$$\alpha_i = \frac{2}{\sqrt{\pi}} m_i n_i v_{thi} \pi a^2 \quad (14a)$$

$$\alpha_0 = \frac{2}{\sqrt{\pi}} m_0 n_0 v_{th0} \pi a^2 \quad (14b)$$

where $v_{thi}$ and $v_{th0}$ are the thermal velocities of the ions and neutrals, respectively; and a is the radius of the particle.

The particle charges to the floating potential of the plasma. The electric charge is given approximately by:

$$q \simeq -3(\kappa T_e/e)\epsilon_0 4\pi a \quad (15)$$

In a glow discharge, the plasma center charges to a positive potential to equalize the ion and the electron loss to the wall. The magnitude of the potential is roughly the floating potential. The negatively charged particles tend to be confined in the central part of the plasma. The force of the particle is given by:

$$qE \simeq 12\pi (\kappa T_e/e)^2 \epsilon_0 a/r_p \quad (16)$$

where $r_p$ is the radius of the plasma. The Oseen or Oseen-like force must be greater than the electrostatic force on the particle in order to remove the particles from the plasma.

The particle also interacts with the plasma ions and the neutral gas. The importance of the drag with the neutral gas depends on the degree of ionization. The velocity of neutral gas may be expressed as:

$$u_0 = \frac{\nu_{i0}(m_i/m_0)(n_i/n_0)u_i}{-i\omega(1 - (m_i/m_0)(T_0/T_e)) + \nu_{i0}(m_i/m_0)(n_i/n_0)} \quad (17)$$

When the degree of ionization is almost 100%, the drag force with the neutral gas is small compared to that with the ions, and is neglected. If the ion density is comparable or smaller than the neutral density ($n_0 \geq n_i$), the neutral velocity is small because $\omega > \nu_{i0}$. Hence, the term $\alpha_0 u_0$ can be neglected, and $$M \frac{dv}{dt} \simeq -\alpha_i \left[ v - u_i + \frac{1}{3} \frac{(v - u_i)^3}{v_{thi}^2} \right] - \alpha_0 v. \quad (18)$$

The first order solution of the relative velocity is given by:

$$v - u_i \simeq ((\alpha_i + \alpha_0)^2 + \omega^2 M^2)^{-1} \{(\omega^2 M^2 + \alpha_0(\alpha_i + \alpha_0))^2 + \omega^2 M^2 \alpha_i{}^2\}^{\frac{1}{2}} \exp[i\Delta\Phi_1] u_i. \quad (19a)$$

Where $$\tan\Delta\Phi_1 = -\omega M \alpha_i(\omega^2 M^2 + \alpha_0(\alpha_i + \alpha_0))^{-1} \quad (19b)$$

then the condition that $|v| \ll |u_i|$ is given by $$\omega M \gg \alpha_i \alpha_0 \quad (20)$$

The mass of a spherical particle with radius a is:

$$M = 4/3 \pi a^3 \rho^* \quad (21)$$

where $\rho^*$ is the density of the particle material. Thus, Eq. (20) becomes:

$$\omega \gg \frac{3}{2\sqrt{\pi}} \frac{(n_0 m_0 v_{th0} + n_i m_i v_{thi})}{\rho^* a} \quad (22)$$

For partially ionized plasma, the condition $\omega > \nu_{i0}$ exists. Hence, the condition of Eq. (22) is automatically satisfied when $$a > \frac{3(n_0 m_0 v_{th0} + n_i m_i t_{thi})}{2\sqrt{\pi} \rho^* \nu_{i0}} \quad (23)$$

By using $$\nu_{i0} = v_{thi} \sigma_s n_0 \quad (24)$$

and assuming that $m_i = m_0$, and $v_{thi} = v_{th0}$, and where $\sigma_s$ is the ion-neutral collision cross-section, one obtains:

$$a > \frac{3m_0(1 + n_i/n_0)}{2\sqrt{\pi}\, \rho^* \sigma_s} \quad (25)$$

Assuming representative values of $\rho^*$ ($10^3$ kg m$^{-3}$), $m_0$ ($1.2\times 10^{-26}$ kg) and $\sigma_s$ ($4\times 10^{-19}$m$^2$), the condition expressed in Eq. (25) becomes $$a > 2\times 10^{-10}(1 + n_i/n_0) \quad (26)$$

and is readily satisfied.

For fully ionized plasma, the condition of Eq. (22) becomes $$\omega >> \frac{3}{2\sqrt{\pi}} \frac{n_i m_i v_{thi}}{\rho^* a}. \quad (27)$$

The ion density of a glow discharge plasma seldom exceeds $10^{19}$m$^{-3}$. By taking $\rho^* = 10^{19}$m$^{-3}$, $m_i = 4.8\times 10^{-26}$ kg and $V_{thi} = 300$ m sec$^{-1}$, it is seen that:

$$\omega >> 1.2\times 10^{-7}/a \quad (28)$$

which condition is also readily satisfied.

The Oseen or Oseen-like force may be calculated on the assumption that the above conditions are satisfied. It is given by:

$$F_0 = \frac{3p_i}{\sqrt{\pi}}\left(\frac{A_1^2 A_2}{v_{thi}^3}\right)\pi a^2 \quad (29)$$

where $p_i$ is the plasma ion pressure. In terms of a plasma sound wave having power flux $P_1$ (fundamental) and $P_2$ (second harmonic), Eq. (29) may be expressed as:

$$F_0 = \frac{3}{\sqrt{\pi}}\left(\frac{P_1}{v_s}\right)\left(\frac{P_2}{v_s p_i}\right)^{\frac{1}{2}}\pi a^2 \quad (30a)$$

with $$(A/V_{thi})^2 = P_1/(v_s p_i) \quad (30i)$$

The velocity amplitude A is related with the density modulation by:

$$\frac{\tilde{n}_i}{n_i} = A/v_s \quad (31a)$$

and $$A/v_{thi} = \frac{\tilde{n}_i}{n_i}\sqrt{\frac{T_e}{T_i}}. \quad (31b)$$

From the above, it is seen that an amplitude of $A \sim v_{thi}$ can be achieved with about a 10% density modulation.

The condition that the Oseen or Oseen-like force be larger than the electrostatic force is given by $$\frac{3}{\sqrt{\pi}} p_i\left(\frac{A_1^2 A_2}{v_{thi}^3}\right)\pi a^2 > 12\pi\left(\frac{\kappa T_e}{e}\right)^2 \epsilon_0 a/r_p \quad (32a)$$

or

If $p_i = 4.2\times 10^{-2}$ Nm$^{-2}$, $T_e = 2$ ev, $r_p = 1$ cm and $A_1 \sim A_2 \sim V_{thi}$, it is seen that $a > 1.6\times 10^{-7}$ m and the sound wave power flux is 57 w/m$^2$.

The plasma sound wave is excited by applying an a.c. voltage between two grids. The current density j is limited to the ion saturation current. That is:

$$j = en_i v_{thi}/4 \quad (33)$$

The voltage required to draw the ion saturation current is approximately $3\kappa T_e/e$. Therefore, the power input $p_i$ per unit area to the plasma is:

$$P_i = \tfrac{3}{4} n_i v_{thi} \kappa T_e \quad (34)$$

Using the above parameters, it is seen the $P_i = 10^3$ W/m$^2$. Combining Eqs. (30a) and (34) shows that $$\left(\frac{A}{v_{thi}}\right)^2 = \frac{YP_i}{v_s p_i} = 2\sqrt{\frac{T_e}{T_i}}\, Y \quad (35)$$

where Y is the efficiency of the grid antenna. Since $T_e/T_i \sim 100$, an efficiency of only several percent is required to obtain $(A/v_{thi}) \sim 1$.

Thus, from the above, it is seen that relatively large solid particles, e.g., dust particles, can be kept away from the surface of a workpiece using Oseen or Oseen-like forces developed as a result of launching a neutral sound wave or a plasma sound wave into the plasma.

OSEEN AND OSEEN-LIKE FORCES IMPORTED BY A HIGH-LEVEL PLASMA SOUND WAVE

In the above analysis (wherein the Oseen force of a solid particle by a neutral or plasma sound wave is examined), it is assumed that the sound wave is weak, i.e., a low-level sound wave wherein the ion velocity $v_i$ due to the sound wave is comparable or smaller than the thermal velocity of the ions $V_{thi}$, i e , that $v_i \leq v_{thi}$. In the case of a strong plasma sound wave, the ion velocity may be much larger than the thermal velocity if the electron temperature $T_e$ is much higher than the ion temperature $T_i$. The relationship between the ion density modulation $n_i$ and the velocity is given by $$v_i/v_{ith} = [n_i/n_{i0}][\gamma/2 + T_e/(2T_i)]^{\frac{1}{2}} \quad (36)$$

where $n_{i0}$ is the undisturbed ion density.

Eq. (36) shows that the condition $v_i >> v_{thi}$ is possible with the constraint that $n_i/n_{i0} < 1$, if $T_e >> T_i$. When $v_i >> V_{thi}$, the nature of the collisional drag force exerted by the ions on a solid particle, a neutral atom, and an impurity ion changes.

The collisional frequency $v_i$ between the ions and a particle is given by $$v_i = \sigma |w|(n_{i0} + n_i) \tag{37}$$

where $\sigma$ is the collisional cross-section and w is the relative velocity between the ion and the particle. If the particle velocity is small and $v_i \gg v_{thi}$, the collision frequency is given by $$v_i \approx \sigma(v_i)|v_i|(n_{i0} + n_i) \tag{38}$$

The drag force F becomes $$F = \frac{m_i m}{m_i + m} v_i v_i \tag{39}$$
$$\approx \frac{m_i m}{m_i + m} \sigma(v_i)|v_i|v_i(n_{i0} + n_i)$$

where $m_i$ and m are the ion mass and the mass of the test particle, respectively.

For a solid particle, the cross section is the geometrical cross section and is independent of the ion velocity. The drag force $F_p$ is thus given by:

$$F_p \approx \frac{m_i m}{m_i + m} (\pi a^2)|v_i|v_i(n_{io} + n_i) \tag{40}$$

where a is the radius of the particle. Note that the drag force proportional to the ion velocity is absent. The drag force takes advantage of the $|v_i|v_i$ dependence, and obtains a finite time-averaged drag force by the addition of the second harmonics.

The collision cross sections between an ion and an atom or a molecule are generally decreasing functions of $v_i$. The attractive potential is proportional to $r^{-4}$ because the interaction is between a charge and an induced dipole. The repulsive core is like the van der Waals repulsive core. A theoretical model, see Massey et al., *supra*, at p. 375, predicts that the scattering cross section if proportional to $v_i^{-\frac{1}{2}}$. The scattering cross section of a proton with a hydrogen atom is documented in the art and is proportional to approximately $v_i^{-0.3}$. See, Barnett et al., *Atomic and Molecular Collision Cross Sections of Interest in Controlled Thermonuclear Research*, ORNL Report ORNL-3113, p. 193 (30th ed. 1964). The scattering cross section of a proton with a hydrogen molecule is also known, see Barnett et al., *supra* at p. 191, and at a few eV energy behaves like $v_i^{-1.7}$. Thus, the value of $\sigma|v|$ for a proton increases with the ion velocity in hydrogen atoms and decreases with the ion velocity in hydrogen gas.

The velocity $v_z$ of an impurity ion with charge Z and mass $m_z$ driven by a sound wave is given by $$v_z = \frac{Zm_i}{m_z} v_i \tag{41}$$

and the relative velocity between the ion and the impurity ion is given by $$v_i - v_z = \left(1 - \frac{Zm_i}{m_z}\right)v_i \tag{42}$$

There is a collisional drag force between the ion and the impurity ion if $Zm_i \neq m_z$. The Coulomb collision cross section is proportional to $v_i^{-4}$ and $\sigma v_i$ behaves like $v_i^{-3}$.

To illustrate different cases, assume that $\sigma = \sigma_0 (v/v_{th})^{-q}$ (where q in this instance is not the electrical charge, but is a variable used to track different cases) for $v > v_{th}$, and $\sigma v = \sigma_0 v_{th}$ for $v \leq v_{th}$ ($v_{th}$ is the ion thermal velocity). The drag force is then given by $$F = \frac{m_i m}{m_i + m} \sigma(w)|w|w(n_{i0} + n_i) \tag{43}$$
$$= \frac{m_i m}{m_i + m} \sigma_0 v_{th}^q |w^{-q+1}|w(n_{i0} + n_i)$$

where $w > v_{th}$. There are two mechanisms that lead to a time-averaged drag force, the hydrodynamic (or ponderomotive) force, and the harmonic distortion (or Oseen-like) force. The hydrodynamic force results from the $wn_i$ term and is of no interest in this description.

A finite time-averaged drag force is obtained by driving the plasma sound wave at the fundamental frequency $\omega$ and at the second harmonic $2\omega$. That is, $$v_i = v_1 \sin(kx - \omega t + \psi_1) + v_2 \sin(2kx - 2\omega t + \psi_2). \tag{44}$$

The test particle also oscillates at both frequencies as does the relative velocity. As a result, the drag force has a finite time average unless $q = 1$. The relative velocity acquires a time-averaged value because of the finite time-averaged drag. As the time-averaged relative velocity increases, the time-averaged drag force decreases until a steady state is reached when the time-averaged drag force vanishes. Thus, assuming a fundamental and second harmonic, it is seen that $$w = w_1 \sin(kx - \omega t + \psi_1) + w_2 \sin(2kx - 2\omega t + \psi_2) + w_0. \tag{45}$$

The value of $w_0$ (the drift velocity) is obtained by the condition $$<|w^{-q+1}|w> = 0 \tag{46}$$

where $<>$ denotes the average over time.

The oscillatory parts of w are obtained from $$m\frac{du}{dt} = -Ze\Delta\phi + \frac{mm_i}{m_i + m} \sigma v_{th}^q |w^{-q+1}|w\, n_{i0} \tag{47}$$

where u is the velocity of the test particle, $\Phi$ is the electrostatic potential of the plasma sound wave, and $w = v_i - u$.

Figure 7:
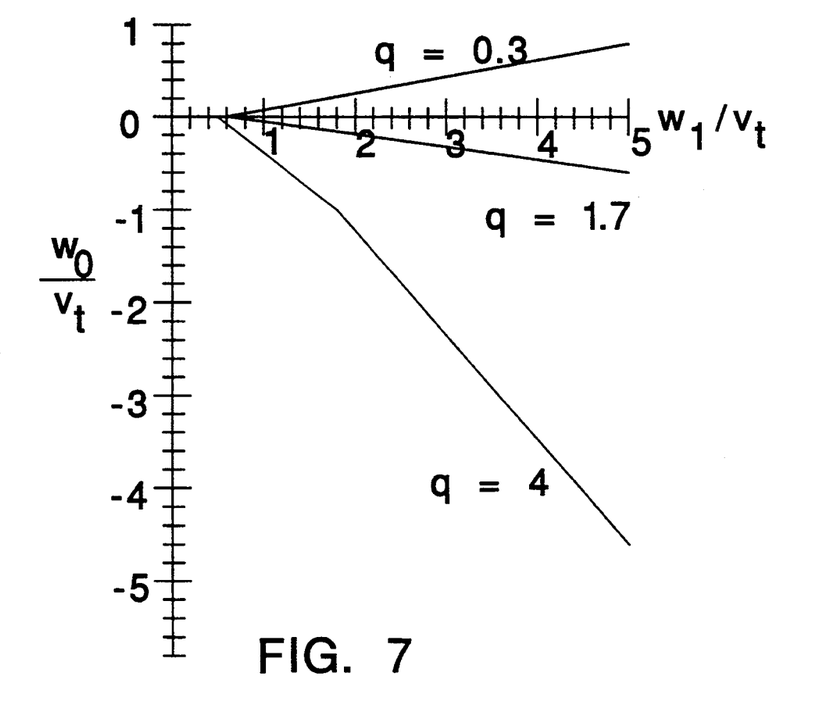
FIG. 7 shows the solutions obtained for the drift velocity, $w_0$, for various conditions.

In solving Eq. (47), the fundamental and the second harmonic components of $|w^{-q+1}|$ are first calculated. Examples of the solution $w_0$ obtained from Eq. (46) are shown in FIG. 7. The numerical results shown in FIG. 7 are for $w_0$ vs. $w_1 = w_2$ with $q = 0.3$ (proton-hydrogen atom), q=1.7 (proton-hydrogen gas) and q=4 (proton-impurity ion). As seen in FIG. 7, no force results until the relative velocity exceeds the thermal velocity. Above the thermal velocity, the drift velocity, $w_0$, can become a significant fraction of the driving velocity. Note also from FIG. 7 that the sign of $w_0$ changes at q=1. Hence, the direction of the drift velocity can be controlled by appropriate control of q.

Next, the plasma sound wave launching mechanism needed for moving atomic-sized particles is described. A suitable plasma sound wave launcher comprises, as explained previously, two conductive grids with an oscillating voltage connected between them. Both grids act as a sink of ions with the more negatively biased grid being the larger sink. The oscillating sink of ions may be treated as a source term in the ion continuity equation. Using probe theory, the ion current to a probe is given by $$I_i \approx \exp(-\tfrac{1}{2}) A_s n_\infty C_s \qquad (48)$$

where $A_s$ is the collecting area including sheath effects, $n_\infty$ is the plasma density far from the probe, and $C_s$ is the speed of the plasma sound wave. The electron current to the probe may be expressed as:

$$I_e = -\tfrac{1}{4} e A_s n_e \bar{v} = -e A_s n_\infty e^{e\phi/K_B T_e} \sqrt{\frac{T_e}{2\pi m_e}} \qquad (49)$$

where $\bar{v}$ is the average electron speed, which is equal to $2 v_{te}/(\pi)^{\frac{1}{2}}$ (where $v_{te}$ is the electron thermal velocity). Thus, the total current sunk to a grid at potential $\Phi_1$ is:

$$I_1 = e n_\infty A_1 \exp(-\tfrac{1}{2}) C_S \left[ 1 - e^{e\phi_1/K_B T_e} \left(\frac{\exp(1)}{2\pi}\right)^{\frac{1}{2}} \left(\frac{m_i}{m_e}\right)^{\frac{1}{2}} \right] \qquad (50)$$

Applying current conservation to Eq. (50), the current sunk to the first grid is the same as that emitted from the second grid, or $I_1=I_2$. If $\Phi_1 > \Phi_2$ (where $\Phi_2$ is the potential of the second grid), then $\Phi_1 - \Phi_f \cong 0$, where $\Phi_f$ is the floating potential. On the other hand, $\Phi_2 = \Phi_1 - \Phi \approx -\Phi$ if $|\Phi| >> |\Phi_f|$, and the electron current contribution to $I_2$ may be ignored.

The difference in ion current may thus be expressed as:

$$I_2 - I_1 = e n_\infty C_s \exp(-\tfrac{1}{2})[A_2 - A_1]. \qquad (51)$$

Assuming a cylindrical probe or wire, $$A \sim A_p(1 + x_s/a) \qquad (52)$$

where $A_p$ is the area of the wire, $a$ is the radius of the wire, and $x_s$ is the sheath thickness. The sheath thickness may be expressed as $$x_S = 1.02 \lambda_D \left[ \left( -\frac{e\phi}{K_B T_e} \right) + \frac{1}{\sqrt{2}} \left( -\frac{e\phi}{K_B T_e} \right)^{\frac{1}{2}} - 1 \right]. \qquad (53)$$

See Hutchinson, *Principles of Plasma Diagnostics*, (Cambridge University Press, 1987). For $\Phi \leq \Phi_f$, the linear term dominates. Substituting appropriate values into Eq. (51), it is seen that $$I_2 - I_1 \simeq e n_\infty C_s \exp(-\tfrac{1}{2}) A_p \frac{\lambda_D}{a} \left( -\frac{e\phi}{K_B T_e} \right). \qquad (54)$$

Should the grid comprise N wires of length L and spaced a distance d apart, then $$A_p = 2NLa = (Nd)L2a/d = A2a/d. \qquad (55)$$

Hence, $$\dot{N} = -(I_2 - I_1)/e = +(n_\infty A C_S) 2\exp(-\tfrac{1}{2}) \left( \frac{\lambda_D}{w} \quad \frac{e\phi}{K_B T_e} \right) \qquad (56)$$

which is the sought-after sink term for the ion continuity equation.

For one grid, $$I_{ion} - e n_\infty C_S \exp(-\tfrac{1}{2}) A_p \left[ 1 + \frac{\lambda_D}{a} \left( -\frac{e\phi}{K_B T_e} \right) \right]. \qquad (57)$$

For time dependence, assume that $$\Phi(t) = \Phi_0 \sin \omega t \qquad (58)$$

when $0 < \omega t - 2n\pi < \pi$, and $\Phi_f \approx 0$ when $\pi < \omega t - 2n\pi < 2\pi$. The Fourier series for this is:

$$\phi(t) = \qquad (59)$$

$$\frac{\phi_0}{\pi} \left( 1 + \frac{\pi}{2} \sin \omega t - \frac{2}{3.1} \cos 2\omega t - \frac{2}{3.5} \cos 4\omega t \dots \right).$$

Thus, it is seen that a second harmonic is already present, although the phase is not the desired phase. Note that the first harmonic is $\tfrac{1}{2}\Phi_0 \sin \omega t I$ and this may be used below to estimate the driving efficiency.

From $I_{ion}$, it is seen that the first harmonic component (using $\exp(-\tfrac{1}{2})=0.61$) is:

$$\dot{N} = \frac{I_{ion}}{e} = 0.61 n_\infty A C_S \frac{\lambda_0}{d} \frac{e\phi_0}{K_B T_e} e^{-i\omega_0 t} \qquad (60)$$

The ion continuity equation may be expressed as $$\partial_t n + n_0 \partial_x v = S(x) = S_0 \delta(x) e^{-\omega_0 t} \qquad (60)$$

where $$\int S_0 \delta(x) dx = \frac{\dot{N}}{A} \qquad (62)$$

and so $$S_0 \simeq 0.61 \frac{\lambda_0}{d} \frac{e\phi_0}{K_B T_e} n_0 C_S. \qquad (63)$$

The continuity equation, Eq. (61), must be solved in conjunction with the momentum equation, which for the case of cold ions is expressed as:

$$m_i n_0 \partial_t v = eE = -\partial_x p_e = -T_e \partial_x n. \quad (64)$$

Combining Eqs. (61) and (64) yields:

$$\partial_u v - C_S^2 \partial_{xx} v = -\frac{C_S^2 S_0}{n_0} \delta'(x) e^{-i\omega_0 t} \quad (65)$$

If the source term is turned on at $t=0$ and at infinite space, Eq. (65) may be solved using Fourier-Laplace transforms, yielding:

$$v(x,t > 0) = \quad (66)$$

$$\frac{S_0}{2n_0} [e^{-i(\omega_0 t + K_0 x)} u(x + C_S t) - e^{-i(\omega_0 t - K_0 x)} u(x + C_S t)]$$

where $u(x-x_0)=1$ for $x$ between 0 and $x_0$, and zero elsewhere. Thus, $$V_i = |v(x > 0)| \simeq 0.30 \frac{\lambda_D}{d} \frac{e\phi_0}{K_B T_e} C_S. \quad (67)$$

By requiring that $v_i > v_{th} = [2t_i/m_i]^{\frac{1}{2}}$, a constraint on $d$, the grid spacing, is thus derived as:

$$d > 3 \times \quad (68)$$

$$10^{-5} m \left(\frac{e\phi_0}{K_B T_e}\right) \left(\frac{T_e}{10 \text{ eV}}\right)^{\frac{1}{2}} \left(\frac{10^{19}/m^3}{n_0}\right) \left(\frac{300° \text{ K.}}{T_i}\right)^{\frac{1}{2}}.$$

Finally, the power requirements from the energy density flow may be expressed as $$\frac{1}{2} \rho_0 v_i^2 C_S = \quad (69)$$

$$2.5 \left(\frac{v_i}{0.1 C_S}\right) \left(\frac{n_0}{10^{19}/m^3}\right) \left(\frac{T_e}{10 \text{ eV}}\right)^{3/2} \text{kW/m}^2.$$

As seen from Eq. (69), the power requirements are thus rather small, and should not lead to undesirable heating.

It should also be pointed out that other means for exciting a plasma sound wave in the plasma, such as a single grid or other antenna-type structures, may be used. For example, electron cyclotron waves or other high frequency electromagnetic waves may be used to repetitively ionize gas on a time scale commensurate with a plasma sound wave. In such instance, the amplitude of the ionizing electron cyclotron wave would be selected to include the necessary second harmonic component.

An example of a double grid launcher that would be suitable for a parallel place plasma processing geometry using a $CF_4$ plasma with an ion density of $10^{11}$ cm$^{-3}$ and an electron temperature of 2 eV is a pair of wire mesh grids spaced 0.15 inches apart. Each grid should have a wire spacing of about 0.1 inches with a wire diameter of about 0.040 inches. The fundamental frequency for exciting such grids to launch a sound wave in the plasma would be in the range of 1-100 KHz, and the waveform would be a triangular waveform as shown in FIG. 8. For the orientation shown in FIG. 5A, the area of each grid should be large enough to cover the substrate area. For a 6 inch diameter substrate, the power applied to the grids would be on the order of 0.5 W.

From the above, it is thus seen that the present invention provides plasma processing apparatus, or a method of operating plasma processing apparatus, that controls the location of constituents in the plasma so as to enhance the plasma processing operation, e.g., by moving contaminant particles away from the surface of a material being processed, moving reactants near the surface of the material being processed, and/or by removing products away from the surface of the material being processed.

While the invention herein disclosed has been described by means of specific embodiments and applications thereof, numerous modifications and variations could be made thereto by those skilled in the art without departing from the scope of the invention set forth in the claims.

What is claimed is:

1. Plasma processing apparatus comprising:
    a plasma processing chamber;
    means for introducing a prescribed gas into said plasma processing chamber;
    means for establishing and maintaining a plasma from said gas within said plasma processing chambers, said plasma processing chamber including a workpiece to be processed by said plasma;
    launching means for launching a periodic sound wave into said plasma, said sound wave being characterized by an intensity and fundamental frequency and harmonic content that includes at least a second harmonic, said sound wave interacting with a constituent within said plasma so as to impart a drift velocity thereto;
    control means for controlling the characteristics of said sound wave so as to cause said constituent to move within said plasma as a result of said drift velocity in a desired direction within said plasma processing chamber;
    whereby the location and flow of said constituent within said plasma may be controlled by controlling said sound wave.

2. The plasma processing apparatus as set forth in claim 1 wherein said launching means comprises an antenna structure positioned within said plasma chamber and means for applying an oscillating voltage to said antenna structure.

3. The plasma processing apparatus as set forth in claim 2 wherein said plasma processing chamber has a longitudinal axis, and wherein said antenna structure is positioned near the center of said plasma processing chamber and is oriented so as to excite a neutral or plasma sound wave that propagates substantially parallel to said longitudinal axis.

4. The plasma processing apparatus as set forth in claim 2 wherein said plasma processing chamber has a longitudinal axis, and wherein said antenna structure is positioned within and near one end of said plasma processing chamber, and is oriented so as to excite a neutral or plasma sound wave that propagates substantially parallel to said longitudinal axis.

5. The plasma processing apparatus as set forth in claim 2 wherein said plasma processing chamber has a longitudinal axis, and wherein said antenna structure is positioned within and near one side of said plasma processing chamber, and is oriented so as to excite a plasma sound wave that propagates substantially perpendicular to said longitudinal axis.

6. The plasma processing apparatus as set forth in claim 2 wherein said plasma processing chamber has a longitudinal axis, and wherein said antenna structure is positioned near the center of said plasma processing chamber, and is oriented so as to excite a plasma sound wave that propagates substantially perpendicular to said longitudinal axis.

7. The plasma processing apparatus as set forth in claim 2 wherein said antenna structure comprises spaced-apart conductive electrodes.

8. The plasma processing apparatus as set forth in claim 7 wherein said conductive electrodes include a conductive grid of wires.

9. The plasma processing apparatus as set forth in claim 2 wherein said antenna structure comprises a single conductive electrode comprising a conductive grid of wires.

10. The plasma processing apparatus as set forth in claim 2 wherein said antenna structure comprises a loudspeaker that launches a neutral gas sound wave.

11. The plasma processing apparatus as set forth in claim 1 wherein said constituent that is moved within said plasma as a result of said drift velocity comprises a contaminant particle.

12. The plasma processing apparatus as set forth in claim 11 wherein said control means controls the characteristics of said sound wave so as to impart a drift velocity to said contaminant particles that moves them away from said workpiece.

13. The plasma processing apparatus as set forth in claim 1 wherein said sound wave comprises a plasma sound wave, and wherein said constituent that is moved within said plasma as a result of said drift velocity comprises atomic-sized reactants, including ions and molecules.

14. The plasma processing apparatus as set forth in claim 13 wherein said control means controls the characteristics of said plasma sound wave so as to impart a drift velocity to said atomic-sized reactants that moves them towards said workpiece.

15. The plasma processing apparatus as set forth in claim 1 wherein said sound wave comprises a plasma sound wave, and wherein said constituent that is moved within said plasma as a result of said drift velocity comprises atomic-sized products created by a chemical reaction between reactants within said plasma and the workpiece.

16. The plasma processing apparatus as set forth in claim 15 wherein said control means controls the characteristics of said plasma sound wave so as to impart a drift velocity to said atomic-sized products that moves them away from said workpiece.

17. The plasma processing apparatus as set forth in claim 1 wherein said constituent that is moved within said plasma as a result of said drift velocity comprises at least one of: contaminant particles; atomic-sized reactants, including ions and molecules; and atomic-sized products.

18. The plasma processing apparatus as set forth in claim 17 wherein said control means controls the characteristics of said sound wave so as to impart a drift velocity to: said contaminant particles that moves them away from said workpiece, said atomic-sized reactants that moves them towards said workpiece, and said atomic-sized products that moves them away from said workpiece.

19. Plasma processing apparatus comprising:
a plasma processing chamber;
means for establishing and maintaining a plasma within said plasma processing chamber;
a workpiece positioned within said plasma processing chamber to be processed by said plasma; and
launching means for launching a sound wave into said plasma, said sound wave being characterized by an intensity and fundamental frequency and harmonic content that includes at least a second harmonic, said sound wave interacting with contaminant particles within said plasma so as to impart a drift velocity thereto that carries said contaminant particles away from said workpiece.

20. The plasma processing apparatus as set forth in claim 19 wherein said launching means comprises means for launching a neutral sound wave into said plasma.

21. The plasma processing apparatus as set forth in claim 19 wherein said launching means comprises means for launching a plasma sound wave into said plasma.

22. Plasma processing apparatus comprising:
a plasma processing chamber;
means for establishing and maintaining a plasma within said plasma processing chamber;
a workpiece positioned within said plasma processing chamber to be processed by said plasma; and
launching means for launching a plasma sound wave into said plasma, said plasma sound wave being characterized by an intensity and fundamental frequency and harmonic content that includes at least a second harmonic, said plasma sound wave interacting with atomic-sized reactants, including ions and molecules, within said plasma so as to impart a drift velocity thereto that carries said atomic-sized reactants towards from said workpiece.

23. Plasma processing apparatus comprising:
a plasma processing chamber;
means for establishing and maintaining a plasma within said plasma processing chamber;
a workpiece positioned within said plasma processing chamber to be processed by said plasma; and
launching means for launching a plasma sound wave into said plasma, said plasma sound wave being characterized by an intensity and fundamental frequency and harmonic content that includes at least a second harmonic, said plasma sound wave interacting with atomic-sized products that result from said plasma reacting with said workpiece so as to impart a drift velocity thereto that carries said atomic-sized products away from said workpiece.

* * * * *

UNITED STATES PATENT AND TRADEMARK OFFICE
CERTIFICATE OF CORRECTION

PATENT NO. : 5,350,454
DATED : September 27, 1994
INVENTOR(S) : Ohkawa

It is certified that error appears in the above-indentified patent and that said Letters Patent is hereby corrected as shown below:

Column 11, line 52 (Eq. 2) change "$\psi_1$" and "$\psi_2$" to --$\phi_1$-- and --$\phi_2$--. At column 18, line 32 (Eq. 44), change "$\psi_1$" and "$\psi_2$" to --$\phi_1$-- and --$\phi_2$--. At column 18, line 46 (Eq. 45), change "$\psi_1$" and "$\psi_2$" to --$\phi_1$-- and --$\phi_2$--. At column 19, line 22, insert -- = -- in Eq. (48) between "$I_i$" and "eexp". At column 20, line 28 (Eq. 57), replace "-" between "$I_{ion}$" and "$en_\infty$" with -- = --. At column 20, line 57 (Eq. 60), replace "-$\omega_0 t$" in exponent of "e" with -- -$i\omega_0 t$ --. At column 21, line 61, replace "place" with --plate--. <u>IN THE CLAIMS</u>: At column 22, line 31, change "chambers" to --chamber--. At column 24, line 52, delete "from".

Signed and Sealed this

Tenth Day of January, 1995

Attest:

BRUCE LEHMAN

*Attesting Officer*    *Commissioner of Patents and Trademarks*